(12) United States Patent
Melanson et al.

(10) Patent No.: US 8,068,622 B2
(45) Date of Patent: Nov. 29, 2011

(54) METHOD AND APPARATUS FOR CONTROLLING A SELECTABLE VOLTAGE AUDIO POWER OUTPUT STAGE

(75) Inventors: John L. Melanson, Austin, TX (US); John Christopher Tucker, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 1384 days.

(21) Appl. No.: 11/611,069

(22) Filed: Dec. 14, 2006

(65) Prior Publication Data

US 2008/0144861 A1   Jun. 19, 2008

Related U.S. Application Data

(63) Continuation-in-part of application No. 11/610,496, filed on Dec. 13, 2006.

(51) Int. Cl.
*H03F 99/00*   (2009.01)
(52) U.S. Cl. .......... 381/120; 381/55; 381/111; 381/116; 330/278; 330/279; 330/297; 330/298; 330/51; 330/199
(58) Field of Classification Search ............ 381/120, 381/55, 111, 116; 330/278, 279, 297, 51, 330/199
See application file for complete search history.

(56) References Cited

U.S. PATENT DOCUMENTS

| | | | |
|---|---|---|---|
| 4,873,493 A | 10/1989 | Fuijiwara | |
| 5,289,137 A | 2/1994 | Nodar et al. | |
| 5,442,317 A | 8/1995 | Stengel | |
| 6,104,248 A | 8/2000 | Carver | |
| 6,304,138 B1 | 10/2001 | Johnson | |
| 6,586,992 B1 | 7/2003 | Strakovsky | |
| 6,636,103 B2 | 10/2003 | Wurcer et al. | |
| 7,031,457 B2 | 4/2006 | Melsa | |
| 7,183,857 B2 | 2/2007 | Doy et al. | |

FOREIGN PATENT DOCUMENTS

| | | |
|---|---|---|
| DE | 19858963 A1 | 7/2000 |
| DE | 10140285 A1 | 2/2003 |
| GB | 2360410 A | 9/2001 |
| GB | 2360410 A  * | 9/2001 |

OTHER PUBLICATIONS

Quilter, Patrick "Amplifier Anatomy", QSC Audio Products, published in Sound & Video Contractor Feb. 20, 1993.

* cited by examiner

*Primary Examiner* — Vivian Chin
*Assistant Examiner* — Paul Kim
(74) *Attorney, Agent, or Firm* — Andrew M. Harris; Mitch Harris, Atty at Law, LLC

(57) ABSTRACT

A method and apparatus for controlling a selectable voltage audio power output stage provides a mechanism for raising the selected power amplifier output voltage in time for the arrival of signal peaks to avoid clipping. Signal peaks may either be delayed by delaying an increase in volume control level or enabling signal compression for a predetermined time period, so that sufficient time is provided for the amplifier power supply to stabilize at a higher operating voltage when an increase of power supply voltage is selected. Alternatively, a signal level may be determined at an upstream source, such as a decoder or filter that provides information in sufficient advance of the arrival of the peaks, and used to control the power supply selection, so that the higher power supply voltage level is selected in advance of arrival of the signal peaks that would otherwise cause clipping at the power amplifier output.

24 Claims, 5 Drawing Sheets

METHOD AND APPARATUS FOR CONTROLLING A SELECTABLE VOLTAGE AUDIO POWER OUTPUT STAGE

CROSS REFERENCE TO RELATED APPLICATIONS

This application is a Continuation-in-Part of U.S. patent application Ser. No. 11/610,496 filed on Dec. 13, 2006, having at least one common inventor and assigned to the same Assignee. The specification of the above-referenced parent U.S. Patent Application is incorporated herein by reference.

BACKGROUND OF THE INVENTION

1. Field of the Invention

The present invention relates generally to consumer device audio power output stages, and more specifically, to a control circuit for selecting the power supply voltage of an audio power stage.

2. Background of the Invention

In battery-operated consumer audio devices, the power amplifier output, which is generally utilized to drive a pair of headphones or a speaker can be the primary consumer of battery power. In devices having a linear power amplifier for the output stage, power is wasted during low signal level outputs, since the voltage drop across the active output transistor plus the output voltage will be equal to the constant power supply rail voltage. Even though the current in the transducer is reduced at low signal amplitudes, more power is still wasted by dissipation in the output transistors than is delivered to the load. Battery power is typically only reduced in linear amplifier circuits by lowering the power supply voltage, which limits the available output power and also may not be possible in some applications in which the power amplifier output also serves as a line output signal that must provide a specified signal level at full signal level, for example +5 dBm (15 dB over −10 dBm) as referenced into a 600 ohm load, which requires a signal swing of 3 $V_{p-p}$.

Therefore, it would be desirable to provide a power amplifier circuit for a consumer audio device that has improved efficiency and reduced power dissipation, while maintaining a specified full-signal output level capability. It would further be desirable to provide control mechanisms within such an amplifier circuit that conserve power and reduce power dissipation while avoiding clipping of the audio signal.

SUMMARY OF THE INVENTION

The above stated objectives of providing improved efficiency and reduced power dissipation, while avoiding clipping of the audio signal, is achieved in a linear power amplifier circuit for a consumer audio device and its method of operation.

The power amplifier circuit includes a power supply that has a selectable power supply output voltage, so that the amplifier power supply rail voltage can be lowered to reduce power consumption and decrease power dissipation when the maximum power supply voltage is not needed to amplify an audio signal. The power supply voltage is selected in conformity with an indication of magnitude of the audio signal.

A control circuit that selects the power supply output voltage controls the volume of the signal as well, either with an audio compressor that is enabled until the power supply voltage has stabilized at a higher voltage level, or by delaying an increase in volume due to a volume control setting. Alternatively, the control circuit provides the indication of magnitude from an upstream source of the audio signal such as a decoder or filter, such that the indication of magnitude is provided in sufficient advance of peaks in the audio signal at the amplifier so that the power supply can stabilize at a higher operating voltage before arrival of the peaks at the amplifier.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses a control method and apparatus for selecting a power supply voltage supplied to an audio power amplifier. The voltage of the power supply provided to the final power amplifier stage is selectable and is set in conformity with either an expected or actual signal level of the audio signal being amplified, so that at signal amplitudes that do not require the maximum power supply voltage, the power supply voltage is reduced to conserve power. For example, when amplifying a signal having typical maximum amplitude −6 dB below occasional peaks referenced at 0 dB, the power supply voltage of the final amplifier stage can be reduced by a factor of two during intervals between the above-described peaks, without causing clipping. The result is a potential reduction in power consumption by a factor of four and a reduction in power dissipation by at least that factor over that of an amplifier that does not have a selectable power supply. The control mechanism that select the power supply voltage either delays or suppresses increases in signal volume until a higher selected power supply voltage has stabilized, or receives signal amplitude information from an upstream source in sufficient advance that the power supply has time to stabilize at the higher voltage value before signal peaks arrive.

Figure 1:
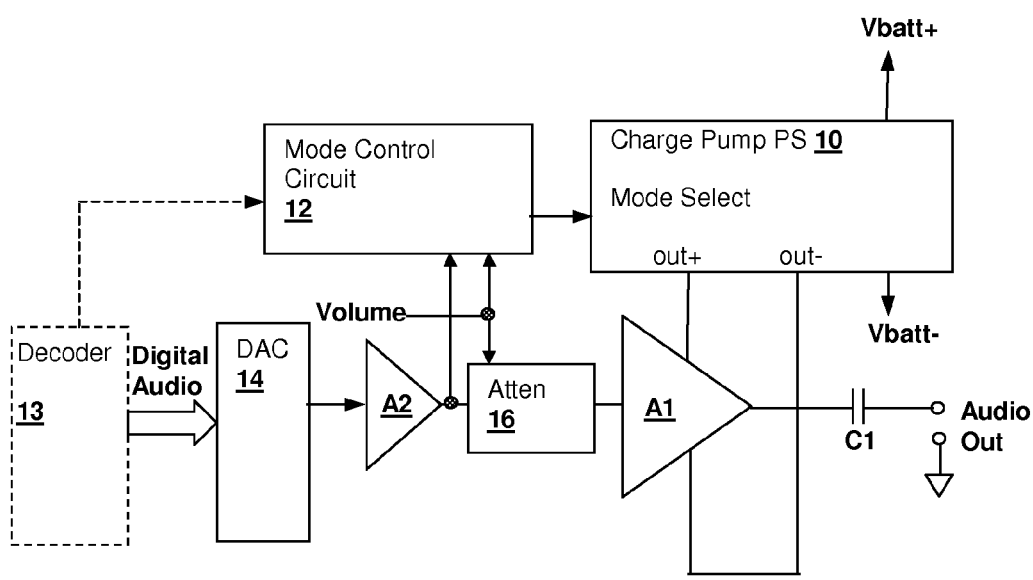
FIG. 1 is a schematic diagram depicting an audio output stage of a consumer audio device in accordance with an embodiment of the invention.

Referring now to FIG. 1, a consumer audio device audio output stage is depicted in accordance with an embodiment of the present invention. A digital-to-analog converter (DAC) 14 supplies an analog signal to a first amplifier stage A2 that is operated from a fixed voltage power supply. The input to DAC 14 may optionally be provided by a decoder 13, that decodes a file or stream data source such as an MP3 encoded data stream. The signal at the output of first amplifier stage A2 is provided to an attenuator 16 that receives a volume control signal and attenuates the signal accordingly. Attenuator 16 may be a digital potentiometer having control provided from a microcontroller or other digital control circuit responsive to a user interface, volume knob encoder or program command, or attenuator 16 may be an analog potentiometer that provides the volume control signal as an output indication from a secondary deck (separate potentiometer circuit coupled to the common shaft or other mechanism) for use in the power supply control algorithms described below. While an attenuator 16 is shown as the volume control mechanism, it is understood that an equivalent volume control may be provided by a programmable resistor in the feedback of amplifier A2 or another amplifier stage in the signal path. A final power amplifier stage A2 amplifies the signal received from attenuator 16 and provides an audio output signal, which may operate a speaker, headphone transducer, and/or a line level signal output. A capacitor C1 may be utilized to couple the output signal to the transducer or line level output, particularly if amplifier A1 is operated from a unipolar power supply having a quiescent voltage substantially differing from ground.

The volume control signal is also supplied to a mode control circuit 12 for controlling the output power supply voltage supplied to the power supply rails of power amplifier A1 in conformity with an expected range of signal levels at the output of power amplifier A1, so that power amplifier A1 will not clip for high (peak) signal levels, but will have a reduced power supply voltage when high (peak) signal levels are not present. Alternatively, or in combination, the output of amplifier A2 is also provided to mode control circuit 12 so that actual signal levels can be measured by mode control circuit 12 and the power supply voltage of power amplifier A1 adjusted in conformity with the actual signal level that will be reproduced at the output power amplifier A1. In the depicted embodiment, since the volume control is applied after the signal level measurement taken from the output of amplifier A2, the volume information is needed even if the signal level is detected by mode control circuit 12, since mode control circuit must also receive information relating to the amount of gain/attenuation that will be applied to the signal prior to amplification by power amplifier A1. Also, an output of decoder 13, if present, may provide an advance notification to mode control circuit 12 that a peak in signal amplitude will be arriving at DAC 14 and thus provide an early indication that the operating mode needs to be changed if the lower voltage/power operating mode of charge pump power supply 10 is selected.

Charge pump power supply 10 provides the power supply rail inputs of amplifier A1 and receives a power supply input, generally from a battery or other power supply, depicted as battery terminal connections Vbatt+ and Vbatt−. Mode control circuit 12 supplies a Mode Select signal to charge pump power supply 10, that selects an operating mode of charge pump power supply 10. Charge pump power supply 10 provides output power supply rail connections out+ and out− that will have a "full" (maximum) voltage in a first operating mode and a voltage that is a rational fraction of the full voltage in a second operating mode, as selected by mode control circuit, when the audio signal level is low enough or expected to be low enough that clipping will not occur at the output of power amplifier A1.

Figure 2:
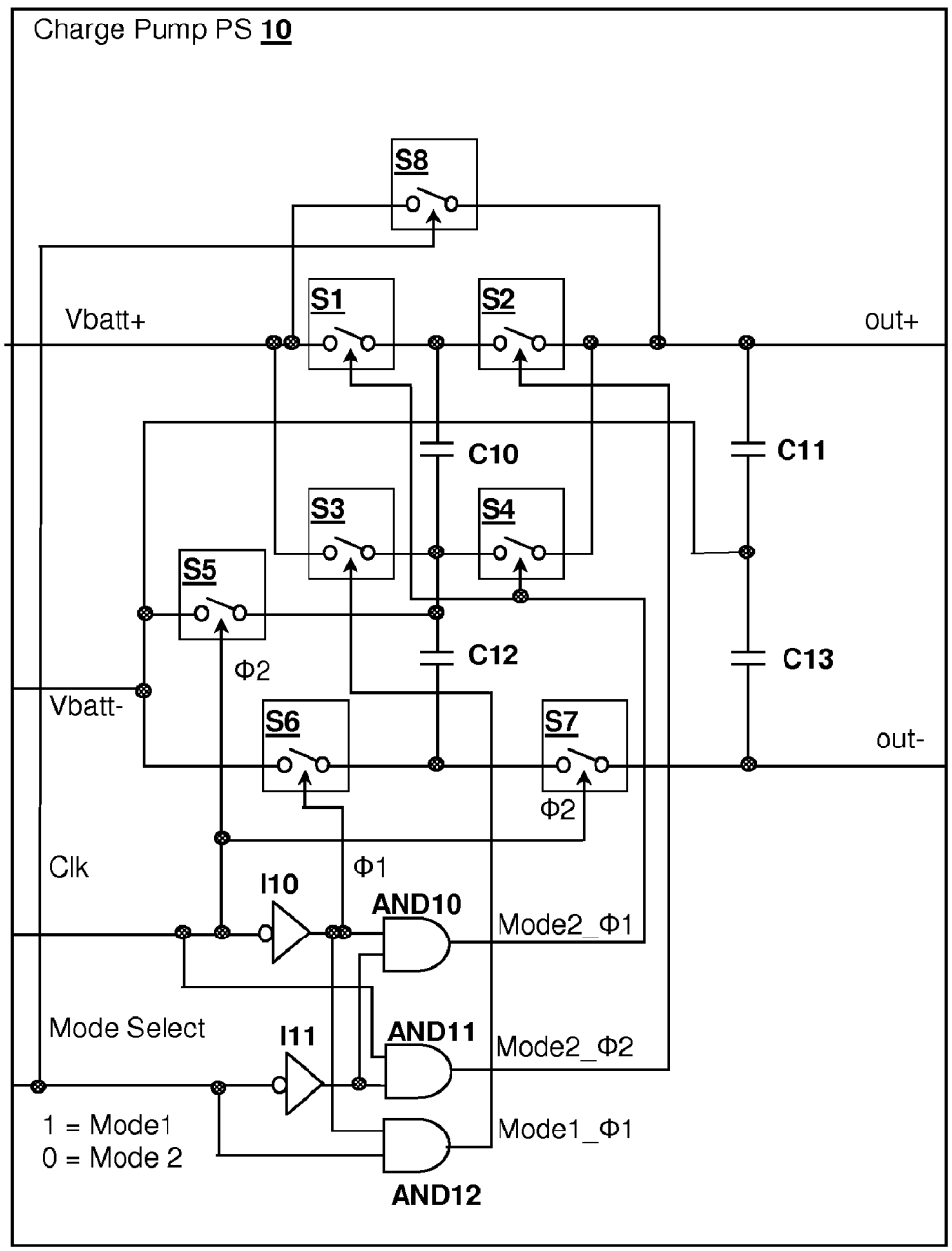
FIG. 2 is a schematic diagram depicting charge-pump power supply 10 of FIG. 1.
Figure 3A:
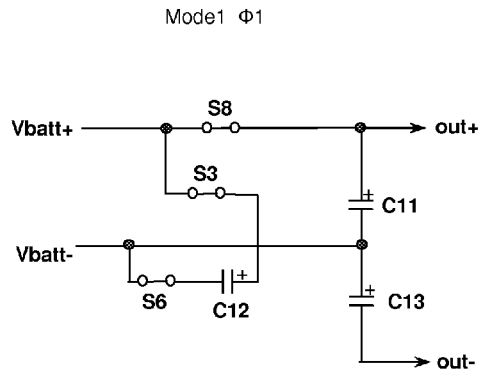
FIGS. 3A-3D are schematic diagrams depicting the individual charge-pump clock phases for each operating mode of the charge-pump power supply circuit of FIG. 2.
Figure 3B:
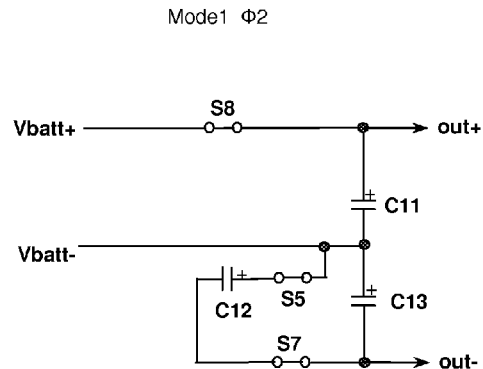

Referring now to FIG. 2, and additionally with reference to FIGS. 3A-3D, details of charge pump power supply 10 are shown. When the first operating mode (Mode 1) is selected, the Mode Select signal is in the logical high ("1") state, and switch S8 is closed, to apply the Vbatt+ voltage directly to the out+ terminal. FIG. 3A and FIG. 3B show the circuit connection arrangement for Mode 1 in the first and second clock phases, respectively, omitting open switches and inactive circuit components. Switches S1, S2 and S4 are open and not activated in the first operating mode, as logical AND gates AND10 and AND11 disable the control signals to switches S1, S2 and S4, as the inverted Mode Select signal provided by inverter I10 is in a logical low ("0") state. For a single-ended (unipolar) power supply, capacitors C12-C13, switches S3, S6 and switch S7 are omitted. As illustrated in FIGS. 3A-3B, in Mode 1, the positive power supply voltage at terminal out+ is supplied directly from the positive input terminal Vbatt+.

To produce the negative output supply voltage in mode 1, the input voltage provided between input terminals Vbatt+ and Vbatt− is inverted by a voltage inverter. In phase one (Φ1) of mode 1, switch S3 is closed and switch S6 is closed, which charges capacitor C12 by connection across input terminals Vbatt+ and Vbatt−, as illustrated in FIG. 3A. While FIGS. 3A-3D show polarized capacitors C10-C13 for purposes of clarity, it is understood that polarized capacitors are not required and that non-polarized capacitors can be utilized for capacitors C10-C13. In phase two (Φ2) of mode 1, switch S3 and switch S6 are opened and switch S5 and switch S7 are closed, which reverses the terminal of capacitor C12 applied to the Vbatt− input terminal. Switch S7 applies the terminal of capacitor C12 that was applied to the Vbatt− input terminal in phase one, to the negative output terminal out−, as further illustrated by FIG. 3B. The switching action described above provides a negative voltage at the out− terminal with respect to the Vbatt− terminal that is substantially equal to the magnitude of the voltage between the out+ terminal and the Vbatt− terminal, which acts as the reference midpoint voltage (ground) at the junction between output capacitors C11 and C13.

In the second operating mode (Mode 2), which is active when the Mode Select signal is in the logical low ("0") state, switch S8 is opened. In phase one (Φ1) of Mode 2, switches S1 and S4 are closed, which apply capacitor C10 in series with output capacitor C11 across the Vbatt+ and Vbatt− terminals, as further illustrated in FIG. 3C. In phase two (Φ2) of Mode 2, switches S1 and S4 are opened and switches S2 and S5 are closed, which connect capacitor C10 in parallel with capacitor C11 as further illustrated in FIG. 3D. Since the second phase of mode 2 equalizes the voltage on capacitors C10 and C11, the stable operating point of the circuit is such that the input voltage between the Vbatt+ and Vbatt− terminals will be split equally during the charging phase, irrespective of the relative capacitance of C10 and C11. Thus the voltage at the out+ output terminal in Mode 2 will be half of the voltage across the Vbatt+ and Vbatt− terminals. Other ratios can be constructed by switching more capacitors in series with capacitors C10 and C11 during phase one, and connecting them all in parallel during phase two. For example, a voltage of one third of the input battery voltage may be produced by using three capacitors connected alternatively in series across the battery terminals and parallel between the out+ terminal and the Vbatt− terminal.

Figure 3C:
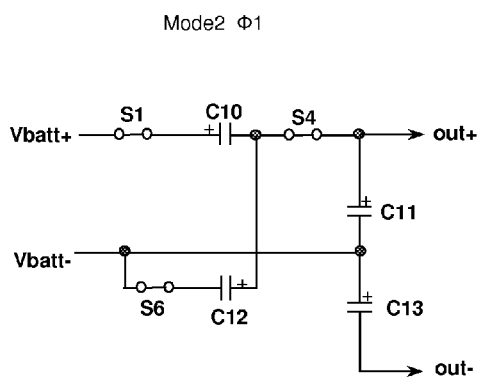
Figure 3D:
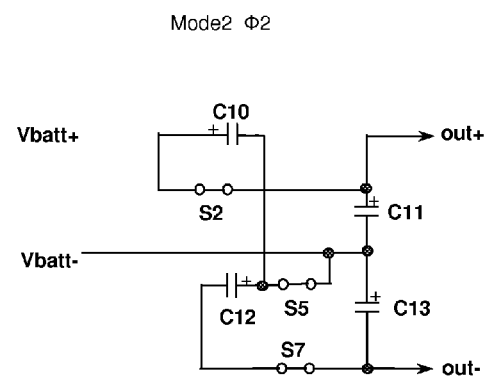

The negative supply in the second operating mode (Mode 2) is provided in a manner similar to that of the first operating mode and the connections of capacitor C12 are shown in FIG. 3B and FIG. 3D, as being the same. However, as illustrated in FIG. 3C, since switch S8 is open in the second operating mode, during phase one of Mode 2, capacitor C12 is charged from the out+terminal rather than the Vbatt+ terminal as was shown in FIG. 3A for Mode 1. Switch S4 performs the operation of connecting capacitor C12 to the out+ terminal, as illustrated in FIG. 3C, along with the above-described operation of applying capacitor C10 in series with capacitor C11 in phase one for the positive power supply and therefore the relative phases between the voltage inverter supplying the out− voltage and the circuit supplying the out+ voltage must be maintained in the depicted configuration. Otherwise, eight switches may be utilized and the common connection between capacitor C10 and C12 broken. The additional switch would be provided between capacitor C12 and the out+ terminal, and would be active in Mode 2, phase 1. It is also possible to further reduce the number of switches from seven to six, by removing switch S3 and controlling switch S4 with the unqualified (Φ1) signal. However, the inclusion of switch S3 reduces the impedance of the power supply path in the first operating mode, which is the highest voltage/current operating mode. Therefore, it is generally advantageous to include switch S3 in the circuit.

Figure 4:
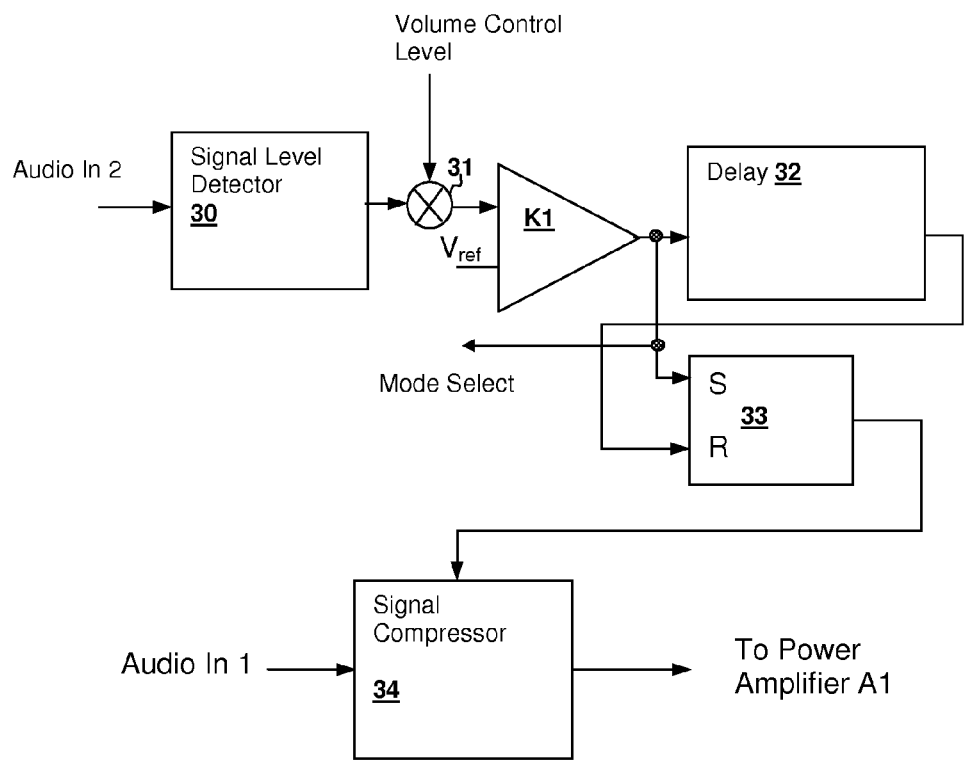
FIG. 4 is a schematic diagram depicting an amplifier control circuit in accordance with an embodiment of the invention.

Referring now to FIG. 4, details of an amplifier control circuit that can be utilized to implement mode control circuit 12 of FIG. 1 is shown. A signal level detector 30, which may be an analog peak detection circuit or the output of a digital circuit that indicates the magnitude of the analog signal at some point in the audio signal path, is optionally combined with downstream volume control information, using a multiplier 31. (If the volume control and signal information are both logarithmic, multiplier 31 is replaced with an adder). A comparator K1 (or equivalent digital domain comparison), determines whether or not the signal level exceeds a threshold $V_{ref}$ and if the threshold is exceeded, then the mode control select signal is set to a high logic level to enable operating mode 1 of the charge pump, providing a higher power supply to power amplifier A1. Suitable time constants can be provided for signal level detector 30 and hysteresis provided within comparator so that mode 2 is not selected unless the peak level of signal has fallen below the threshold for a predetermined time period and/or voltage hysteresis guard band, to prevent excessive changing of the power supply voltage control.

As an alternative, signal level detector 30 can be omitted, and the volume control level can be directly compared to a threshold value, to determine the power supply operating mode and thereby the power amplifier supply rail operating voltage. Since the volume control level is a predictor of the expected peak levels that will need to be reproduced by power amplifier A1, such control will be sufficient in some applications, in particular, applications in which the maximum signal (peak) level is known a priori, such as when the audio signal is supplied from a digital-to-analog converter integrated within the system.

An optional circuit that is responsive to voltage peaks when the power supply circuit is in operating mode 2, is provided by a set-reset latch 33, a delay 32, and a signal compressor 34. When the mode control signal transitions from a logical low level (Mode 2) to a logical high level (Mode 1), set-reset latch 33 is set, and remains set until a predetermined time period of delay 32 has expired. The output of set-reset latch 33 is a pulse that activates signal compressor 34 for the predetermined time, which is generally the time required for the power supply rails of power amplifier A1 to stabilize at the higher power supply rail values of operating mode 1. Signal compressor 34 is inserted in the audio signal path upstream of power amplifier A1, and reduces the signal level to avoid clipping until the power supply rails provided to amplifier A1 are known to be sufficient to support the required output voltage swing without clipping.

Figure 5:
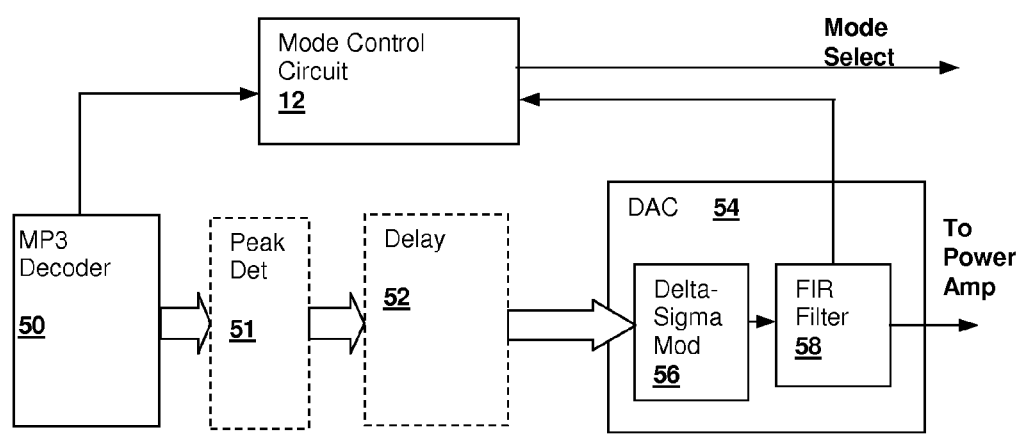
FIG. 5 is a schematic diagram depicting amplifier power supply control mechanisms in accordance with an embodiment of the invention.

Referring now to FIG. 5, amplifier power supply control mechanisms are illustrated in accordance with embodiments of the invention, in which one or more upstream indications of signal level are applied to mode control circuit 12 to select the operating mode of a power amplifier power supply, such as charge-pump power supply 10 of FIG. 1. MP3 decoder 50 is an exemplary digital audio data source, and a control signal may be provided from MP3 decoder 50 that indicates a peak signal level that will require the higher voltage operating mode of the power amplifier in order to avoid clipping. Since MP3 data is encoded in a format that includes gain information in various forms, the gain information can be used to advantageously control the power supply voltage supplied to the power amplifier to avoid clipping, while conserving power when possible. For example, track metadata may include peak gain information (Replay Gain tag), and if the signal peak for a given track or stream does not exceed the threshold of clipping at the lower power amplifier supply voltage, the lower voltage operating mode of the power amplifier power supply may be selected for the entire track/stream. On a frame-by-frame basis, transient frames can be identified by their size of 192 samples vs. 576 and each sub-band granule includes scale factor information that controls the amplitude of the decoded audio for that sub-band and granule. Peak signal levels can therefore be detected during the decoding process and a determination made of whether a peak requiring the higher voltage amplifier power supply will soon be delivered to the power amplifier.

If the time required for the amplifier power supply to stabilize at the higher voltage is greater than the delay time from the peak detection provided from the MP3 decoder 50 to the arrival of the signal at the power amplifier output, then an additional delay can be introduced by a delay circuit 52, which is generally a FIFO (first-in-first-out) memory clocked at the sample rate, but which could be an analog delay located downstream of DAC 54. As an alternative to determining the peaks from information in MP3 decoder 50, a peak detector (digital comparator) 51 can be optionally used in combination with delay 52 (if required) to provide sufficient advance notice of the arrival of signal peaks at the power amplifier by comparing the output of MP3 decoder 50 to fixed threshold values. Finally, if the delay from the output of DAC 54 to the power amplifier is sufficient, a detection within the finite impulse response (FIR) filter 58 of DAC 54 that filters the output of a delta-sigma modulator 56 can provide sufficient advance notice to mode control circuit 12 to select the higher voltage operating mode of the amplifier power supply.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. An audio amplifier circuit for providing an output signal to an audio transducer, said audio amplifier circuit comprising:
   a power amplifier having an audio input for receiving an audio input signal, an audio output for providing said output signal, and a pair of power supply rail connections;
   a power supply for providing a power supply voltage across said pair of power supply rail connections of said power amplifier, wherein said power supply has a selectable power supply voltage level, whereby power consumption of said power amplifier is reduced when said magnitude of said audio input signal is reduced;
   a control circuit for controlling selectable power supply voltage level in conformity with an indication of said magnitude, so that clipping is prevented when said selectable power supply voltage level is increased and has not yet reached a full power supply voltage level; and
   a gain control circuit for controlling a magnitude of said audio input signal in conformity with said indication of said magnitude at least during a time period during which said selectable power supply level is increasing to said full power supply voltage level.

2. The audio amplifier circuit of claim 1, wherein said gain control circuit comprises:
  an input for receiving a volume control value; and
  a delay for delaying an increase in said volume control value and having an output for providing a volume control signal to a volume control circuit of said audio amplifier until a predetermined time period has elapsed, and wherein said gain control circuit further generates said indication of magnitude in conformity with the volume control value and provides the indication of magnitude to the control circuit.

3. The audio amplifier circuit of claim 1, wherein said gain control circuit comprises:
  an input for receiving said indication of magnitude of said audio input signal;
  a signal compressor for providing said audio input signal to said power amplifier from an audio source signal, wherein said signal compressor reduces a dynamic range of said audio input signal from that of said audio source signal; and
  a delay circuit for activating said signal compressor when said indication of magnitude of said audio input signal increases, and de-activating said signal compressor when a predetermined time period has elapsed.

4. The audio amplifier circuit of claim 1, wherein said gain control circuit comprises:
  an input for receiving said indication of magnitude of said audio input signal;
  a gain adjusting circuit for adjusting a level of said audio input signal, wherein said gain circuit reduces said level of said audio input signal when activated; and
  a delay circuit for activating said gain adjusting circuit when said indication of magnitude of said audio input signal increases, and de-activating said gain adjusting circuit when a predetermined time period has elapsed.

5. The audio amplifier circuit of claim 4, further comprising a signal level detector having an input for receiving said audio input signal and an output for supplying said indication of said magnitude to an input of said control circuit and said input of said gain control circuit, whereby said delay circuit activates said gain adjusting circuit in response to a change in signal level of said audio input signal.

6. The audio amplifier circuit of claim 5, further comprising a volume control circuit, and wherein said input of said gain control circuit and said control circuit receive said indication of said magnitude as a volume control value from said volume control circuit, whereby said delay circuit activates said compressor in response to an increase in said volume control value.

7. The audio amplifier circuit of claim 1, wherein said indication of magnitude is provided from a digital decoder for decoding audio information to provide said audio input signal, whereby said digital decoder provides said indication of magnitude in advance of arrival of a corresponding portion of said audio signal, whereby said control circuit is operated to raise said selectable power supply voltage upon an increase in amplitude of said audio signal in advance of said arrival of corresponding increase in amplitude, and wherein said gain control circuit is a portion of said decoder that computes said audio input signal using said indication of magnitude.

8. The audio amplifier circuit of claim 7, wherein a delay time between changes in said indication of magnitude and said arrival of said corresponding portion of said audio signal is greater than or substantially equal to a time period required for said power supply voltage to stabilize at a higher voltage when said power supply voltage is increased.

9. A method of improving efficiency of an amplifier for providing a power output to an audio transducer, said method comprising:
  receiving an indication of a magnitude of a signal to be amplified by said amplifier;
  supplying a power supply voltage to said amplifier from a power supply having a selectable power supply voltage level;
  selecting the power supply voltage level in conformity with the indication of magnitude; and
  controlling a gain of said signal in conformity with said indication of magnitude, at least during a time period during which the selectable power supply voltage level is increasing to a full power supply voltage level, so that clipping is prevented when the selectable power supply voltage level is increased and has not reached the full power supply voltage level.

10. The method of claim 9, wherein said indication of said magnitude is a volume control value that controls a volume of said signal, and further comprising delaying an increase of a controlled volume of said signal until a predetermined time period has elapsed after selecting a higher power supply voltage level.

11. The method of claim 9, wherein said controlling comprises adjusting a gain of said signal to a lower gain value for a predetermined time period after selecting a higher power supply voltage level.

12. The method of claim 9, wherein said controlling comprises compressing said signal for a predetermined time period after selecting a higher power supply voltage level.

13. The method of claim 12, further comprising detecting a level of said signal, and wherein said compressing is commenced simultaneously with controlling selecting a higher power supply voltage.

14. The method of claim 13, further comprising:
  receiving an input of a volume control adjustment;
  adjusting a volume of said signal in response to said receiving; and
  determining whether or not said volume control adjustment is an increase in volume of said signal that indicates that a higher power supply voltage should be selected; and
  responsive to determining that a higher power supply voltage should be selected, selecting said higher power supply voltage, and wherein said compressing compresses said signal for a predetermined time after said selecting.

15. The method of claim 9, further comprising:
  decoding a digital representation of said signal; and
  detecting amplitude peak values present in said decoded signal, and wherein said controlling selects said power supply voltage level in response to said detecting said amplitude peak values to increase said power supply voltage.

16. The method of claim 15, wherein said detecting detects said amplitude peak values in advance of arrival of corresponding portions of said signal at said amplifier, such that said power supply voltage has stabilized at a higher selected value before portions of said signal corresponding to said peaks arrive at said amplifier.

17. An audio circuit for providing an output signal to an audio transducer, said audio circuit comprising:
  a digital signal processing circuit for providing a source audio signal and an early indication of magnitude of said source audio signal, wherein the early indication of magnitude is provided from intermediate values used to compute values of the source audio signal within the digital signal processing circuit and are therefore available before computation of the values of the source audio signal;

a power amplifier having an audio input for receiving said source audio input signal, an audio output for providing said output signal, and a pair of power supply rail connections;

a power supply for providing a power supply voltage across said pair of power supply rail connections of said power amplifier, wherein said power supply has a selectable power supply voltage level, whereby power consumption of said power amplifier is reduced when said magnitude of said source audio signal is reduced; and a control circuit for controlling said selectable power supply voltage level in conformity with said early indication of magnitude, wherein said early indication of magnitude provides indications of peaks in said source audio signal so that clipping is prevented when said selectable power supply voltage level is increased and has not yet reached a full power supply voltage level.

18. The audio circuit of claim 17, wherein said signal processing circuit comprises a digital audio decoder having a peak detection output for providing said early indication of magnitude to said control circuit.

19. The audio circuit of claim 17, wherein said signal processing circuit comprises a delay circuit for delaying said source audio signal by a predetermined delay time, whereby said early indication of magnitude is provided in advance of said source audio signal by at least said predetermined delay time.

20. The audio circuit of claim 17, wherein said signal processing circuit comprises a digital-to-analog converter including a digital filter, and wherein said early indication of magnitude is provided by logic within said digital filter.

21. A method of improving efficiency of an amplifier for providing a power output to an audio transducer, said method comprising:

receiving an early indication of a magnitude of a signal to be amplified by said amplifier from a digital signal processing circuit, wherein the early indication of magnitude is provided from intermediate values used to compute values of the signal within the digital signal processing circuit and are therefore available before computation of the values of the signal;

supplying a power supply voltage to said amplifier from a power supply having a selectable power supply voltage level; and selecting said power supply voltage level in conformity with said early indication of magnitude, so that a selected increase in power supply voltage level will have stabilized in advance of arrival of peaks in said signal at said amplifier.

22. The method of claim 21, further comprising:
decoding a digitally encoded representation of said signal; and
generating said early indication of magnitude from an intermediate result of said decoding.

23. The method of claim 21, further comprising:
determining whether or not said magnitude of said signal has exceeded a predetermined value;
generating said early indication of magnitude in response to determining that said magnitude has exceeded said predetermined value; and
delaying said signal by a predetermined delay time, whereby said early indication of magnitude is generated in advance of said arrival of said peaks in said signal at said amplifier by at least said predetermined delay time.

24. The method of claim 21, further comprising generating said indications of magnitude from an intermediate result of digitally filtering an output of a digital-to-analog converter converting said signal to an analog signal.

* * * * *